United States Patent
Campbell et al.

(10) Patent No.: US 7,762,314 B2
(45) Date of Patent: Jul. 27, 2010

(54) COOLING APPARATUS, COOLED ELECTRONIC MODULE AND METHODS OF FABRICATION EMPLOYING A MANIFOLD STRUCTURE WITH INTERLEAVED COOLANT INLET AND OUTLET PASSAGEWAYS

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 379 days.

(21) Appl. No.: 11/739,160

(22) Filed: Apr. 24, 2007

(65) Prior Publication Data

US 2008/0264604 A1   Oct. 30, 2008

(51) Int. Cl.
*F28F 7/00* (2006.01)
*H05K 7/20* (2006.01)
(52) U.S. Cl. .................. 165/80.3; 165/80.4; 361/699
(58) Field of Classification Search ............. 165/80.4, 165/80.3; 361/699
See application file for complete search history.

(56) References Cited

U.S. PATENT DOCUMENTS

| | | | | |
|---|---|---|---|---|
| 4,494,171 A | * | 1/1985 | Bland et al. ................. | 361/704 |
| 4,768,581 A | * | 9/1988 | Gotwald et al. ............ | 165/80.3 |
| 5,070,936 A | | 12/1991 | Carroll et al. | |
| 5,220,804 A | | 6/1993 | Tilton et al. | |
| 5,263,536 A | | 11/1993 | Hulburd et al. | |
| 5,270,572 A | | 12/1993 | Nakajima et al. | |
| 5,274,920 A | * | 1/1994 | Matthews .............. | 29/890.039 |
| 5,309,319 A | * | 5/1994 | Messina ................... | 361/699 |
| 5,727,618 A | * | 3/1998 | Mundinger et al. ........ | 165/80.4 |
| 5,942,432 A | | 8/1999 | Smith et al. | |
| 6,062,301 A | | 5/2000 | Lu | |
| 6,131,650 A | * | 10/2000 | North et al. ................ | 165/170 |
| 6,431,260 B1 | | 8/2002 | Agonafer et al. | |
| 6,498,725 B2 | | 12/2002 | Cole et al. | |
| 6,519,151 B2 | | 2/2003 | Chu et al. | |
| 6,571,569 B1 | | 6/2003 | Rini et al. | |
| 6,935,411 B2 | * | 8/2005 | Valenzuela ................. | 165/80.4 |

(Continued)

*Primary Examiner*—Cheryl J Tyler
*Assistant Examiner*—Brandon M Rosati
(74) *Attorney, Agent, or Firm*—Geraldine Monteleone, Esq.; Kevin P. Radigan, Esq.; Heslin Rothenberg Farley & Mesiti P.C.

(57) ABSTRACT

A cooling apparatus and method of fabrication are provided for facilitating removal of heat from an electronic device. The cooling apparatus includes a manifold structure having a plurality of inlet and outlet passageways for injecting coolant onto, and exhausting coolant after impinging on, a surface to be cooled. The coolant inlet and outlet passageways are interleaved in the manifold structure, and coolant is injected and exhausted through a common edge of the manifold. The manifold structure further includes coolant inlet and outlet plenums, with coolant passing through the inlet passageways from the inlet plenum in a first direction and coolant passing through the outlet passageways to the outlet plenum in a second direction, the first and second directions being perpendicular to the surface to be cooled and being opposite directions, and wherein the manifold structure is contained within a rectangular volume defined by a projection of the common edge.

17 Claims, 15 Drawing Sheets

U.S. PATENT DOCUMENTS

| | | |
|---|---|---|
| 6,940,712 B2 | 9/2005 | Chu et al. |
| 6,986,382 B2 | 1/2006 | Upadhya et al. |
| 7,000,684 B2 | 2/2006 | Kenny et al. |
| 7,017,654 B2 * | 3/2006 | Kenny et al. ............... 165/80.4 |
| 7,026,203 B2 | 4/2006 | Campbell et al. |
| 7,079,393 B2 | 7/2006 | Colgan et al. |
| 7,104,312 B2 | 9/2006 | Goodson et al. |
| 7,156,159 B2 * | 1/2007 | Lovette et al. ......... 165/104.33 |
| 7,255,153 B2 * | 8/2007 | Berger et al. ................ 165/80.4 |
| 7,353,859 B2 * | 4/2008 | Stevanovic et al. ......... 165/80.4 |
| 7,516,776 B2 * | 4/2009 | Bezama et al. ............. 165/80.4 |
| 2004/0182548 A1 * | 9/2004 | Lovette et al. ............... 165/103 |
| 2006/0108098 A1 * | 5/2006 | Stevanovic et al. ......... 165/80.4 |
| 2006/0126308 A1 | 6/2006 | Campbell et al. |
| 2006/0250774 A1 | 11/2006 | Campbell et al. |
| 2006/0266497 A1 * | 11/2006 | Berger et al. ................ 165/80.4 |

* cited by examiner

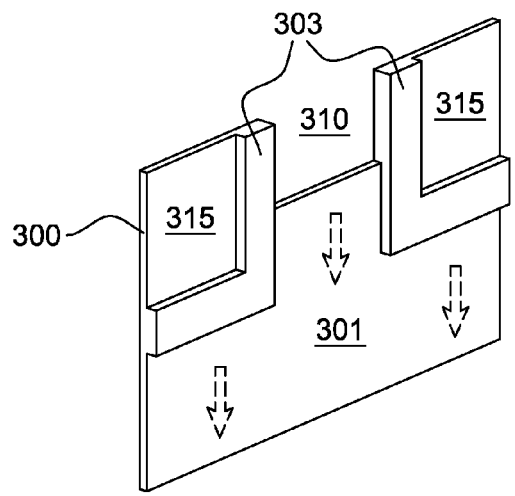 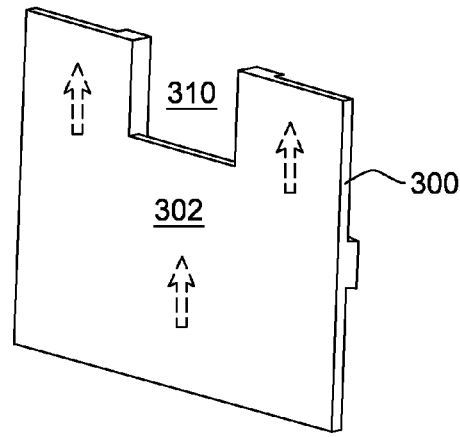
FIG. 3A  FIG. 3B
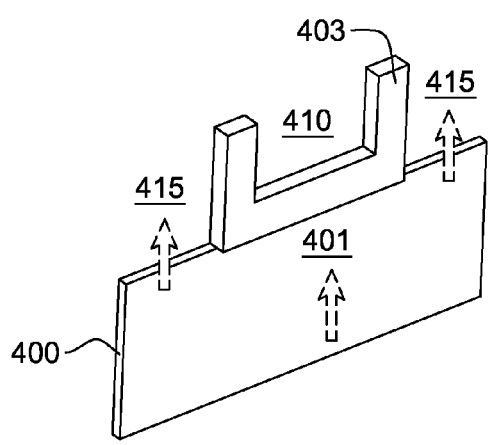 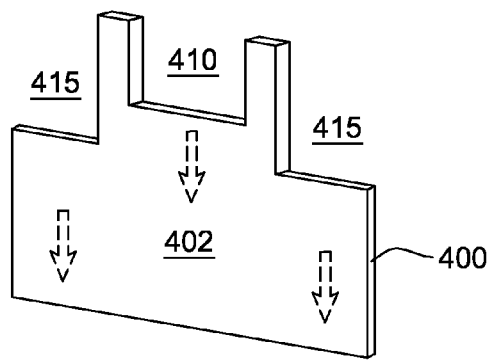
FIG. 4A  FIG. 4B

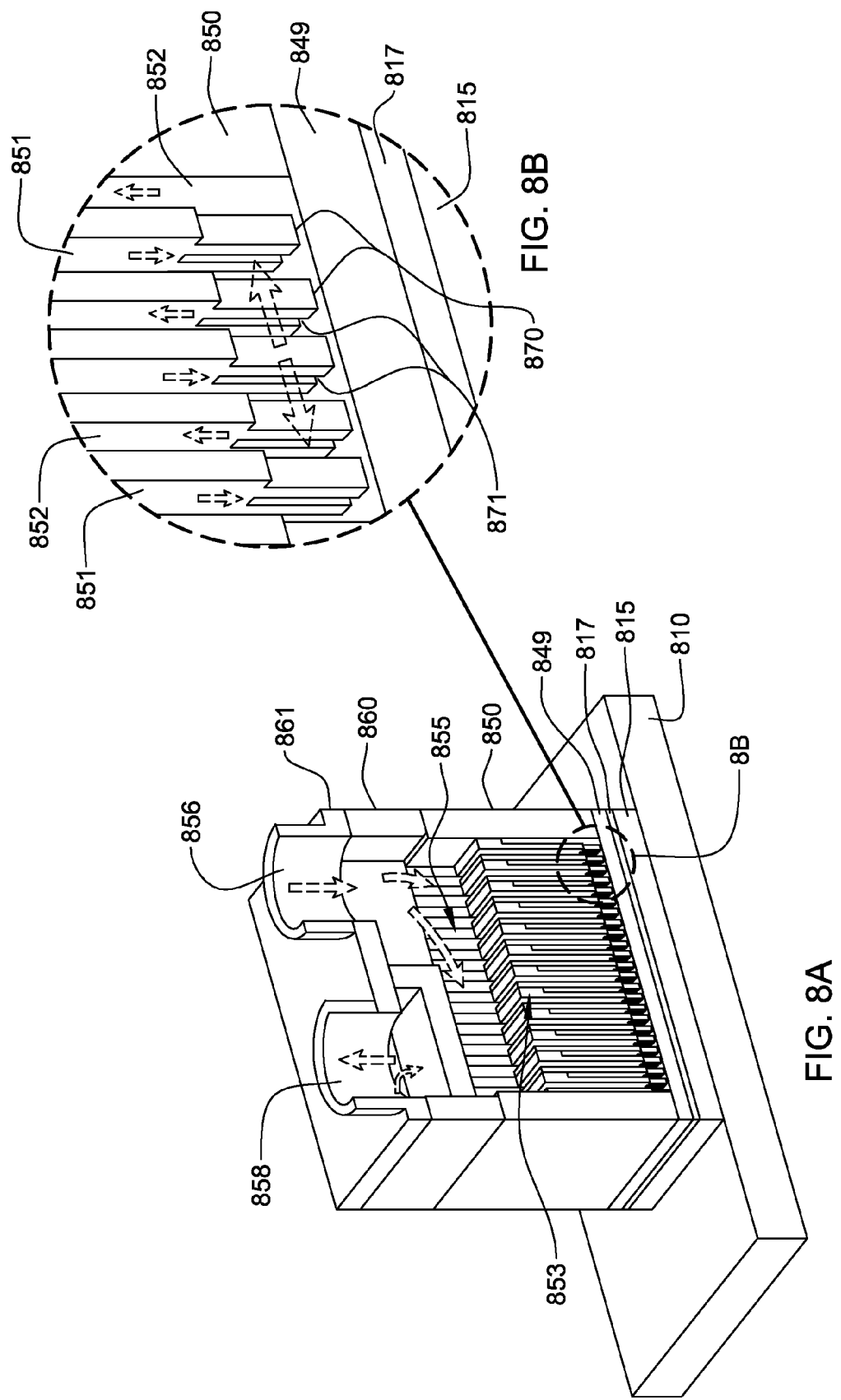

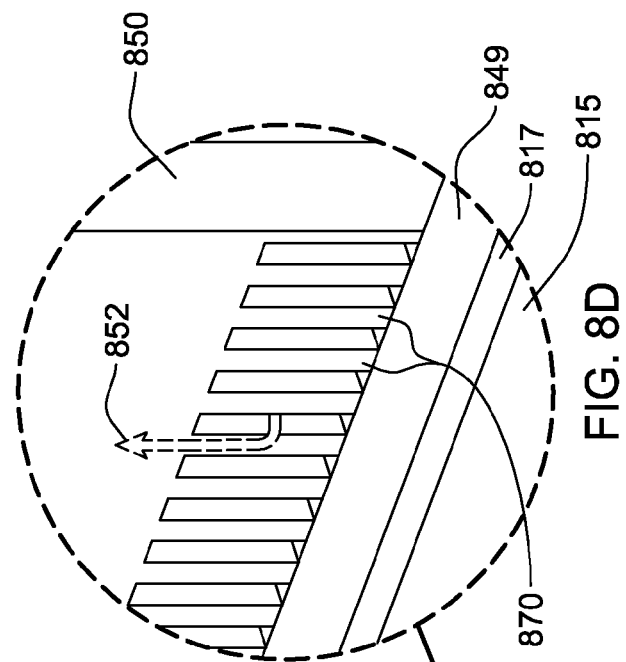
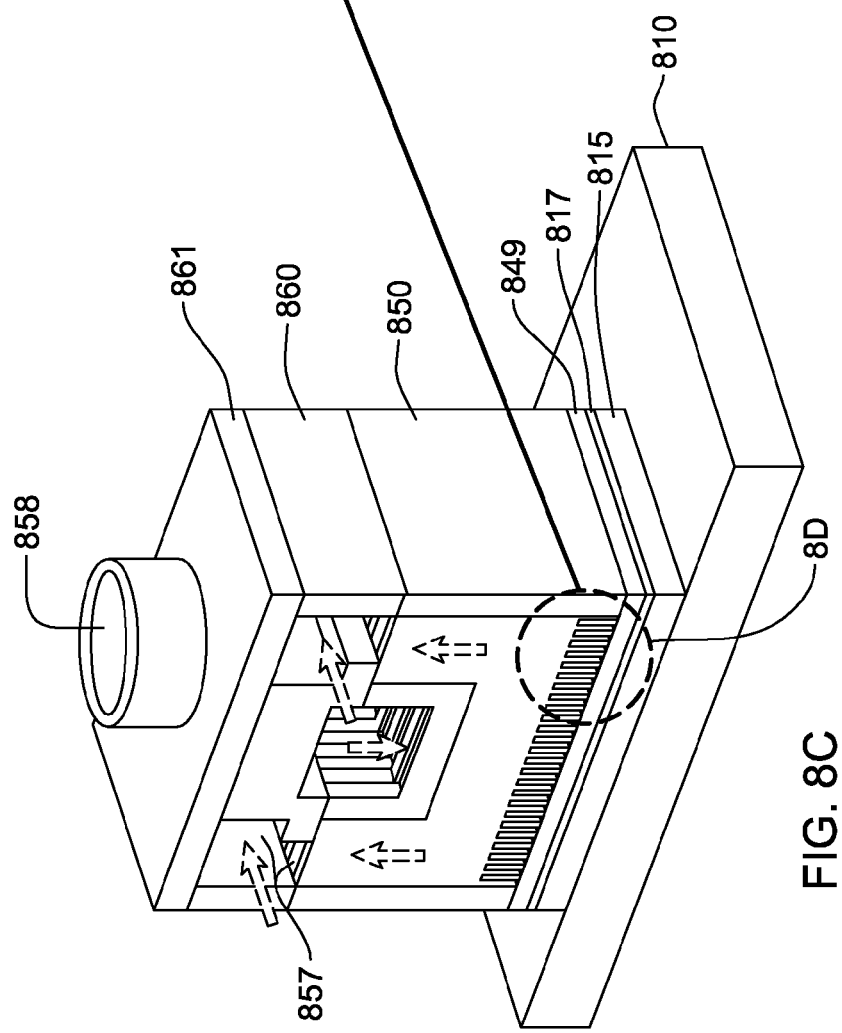

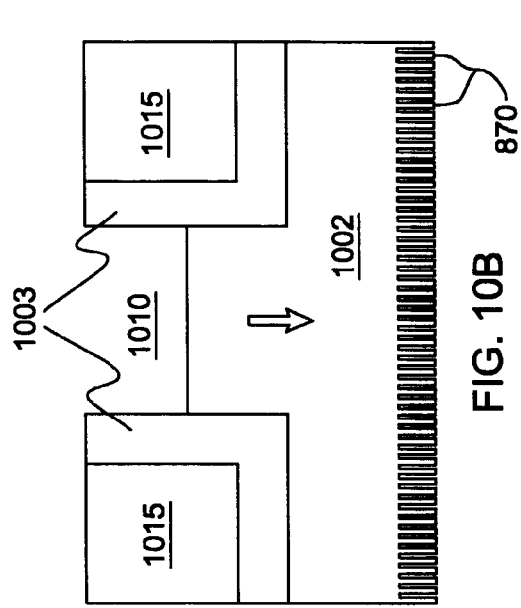
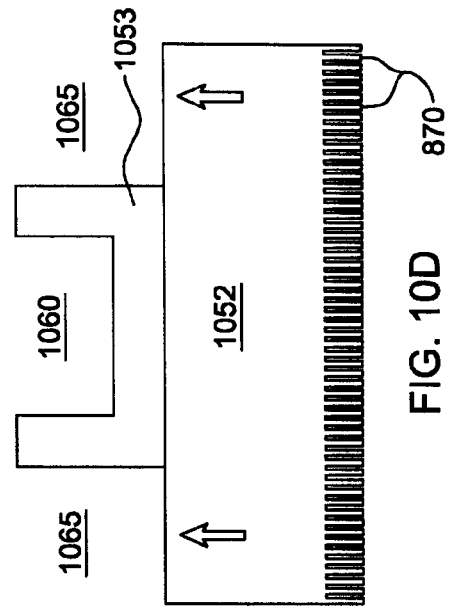
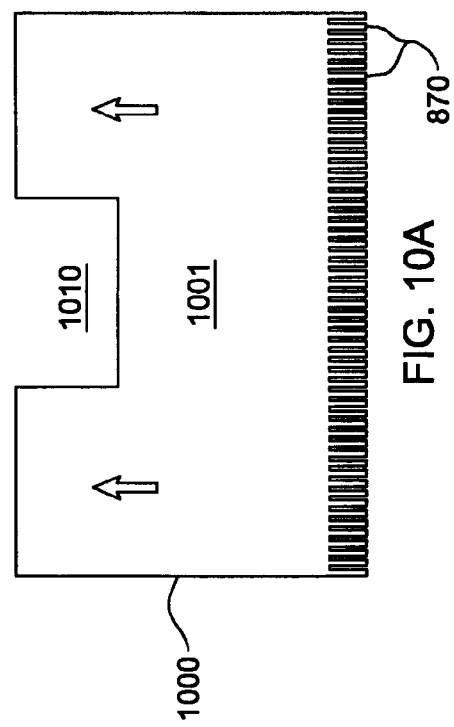
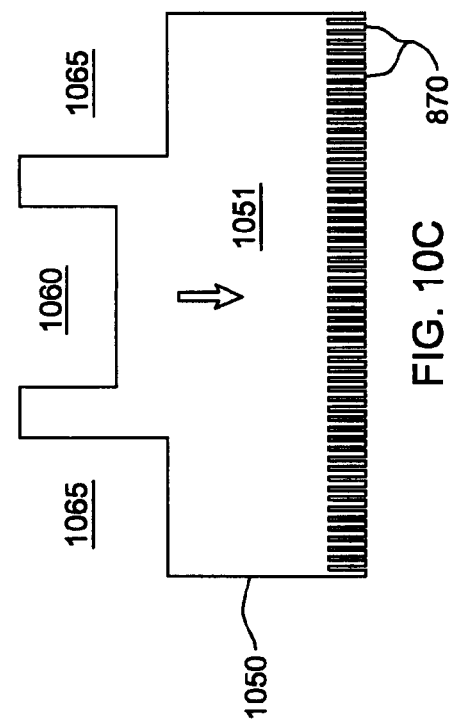
FIG. 10A
FIG. 10B
FIG. 10C
FIG. 10D

COOLING APPARATUS, COOLED ELECTRONIC MODULE AND METHODS OF FABRICATION EMPLOYING A MANIFOLD STRUCTURE WITH INTERLEAVED COOLANT INLET AND OUTLET PASSAGEWAYS

TECHNICAL FIELD OF THE INVENTION

The present invention relates to heat transfer mechanisms, and more particularly, to cooling apparatuses, cooled electronic modules and methods of fabrication thereof for removing heat generated by one or more electronic devices. Still more particularly, the present invention relates to cooling apparatuses and methods employing at least one integrated coolant inlet and outlet manifold structure for facilitating impingement of coolant onto a surface to be cooled and exhausting of coolant after impinging on the surface to be cooled in an effective and efficient manner with minimum or no added footprint beyond the one or more electronic devices.

BACKGROUND OF THE INVENTION

As is known, operating electronic devices produce heat. This heat should be removed from the devices in order to maintain device junction temperatures within desirable limits, with failure to remove the beat thus produced resulting in increased device temperatures, potentially leading to thermal runaway conditions. Several trends in the electronics industry have combined to increase the importance of thermal management, including heat removal for electronic devices in technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

Thus, the need to cool current and future high heat load, high heat flux electronic devices, mandates the development of aggressive thermal management techniques, such as liquid jet impingement or liquid cooled cold plate devices, to cool electronic devices, including integrated circuit chips. The invention disclosed herein is addressed to this continuing need for enhanced liquid based cooling apparatuses and methods.

SUMMARY OF THE INVENTION

The shortcomings of the prior art are overcome and additional advantages are provided through the provision of a cooling apparatus. The cooling apparatus includes a manifold structure having a plurality of inlet passageways for injecting coolant onto a surface to be cooled, and a plurality of outlet passageways for exhausting coolant after impinging on the surface to be cooled. The plurality of inlet passageways and the plurality of outlet passageways are interleaved in the manifold structure for injecting coolant and exhausting coolant, respectively, through a common edge of the manifold structure. The manifold structure further includes a coolant inlet plenum and a coolant outlet plenum. Coolant passes through the plurality of inlet passageways from the coolant inlet plenum in a first direction perpendicular to the surface to be cooled, and passes through the plurality of outlet passageways to the coolant outlet plenum in a second direction perpendicular to the surface to be cooled, wherein the first and second directions are opposite directions, and wherein the manifold structure, including the coolant inlet plenum and coolant outlet plenum, is contained within a rectangular volume defined by a projection of the common edge.

In another aspect, a cooled electronic module is provided which includes a substrate and at least one heat generating electronic device to be cooled coupled to the substrate. A cooling apparatus is coupled to the at least one heat generating electronic device for cooling at least one surface to be cooled. The at least one surface to be cooled comprises at least one of a surface of the at least one heat generating electronic device or a surface coupled to the at least one heat generating electronic device. The cooling apparatus includes a manifold structure having a plurality of inlet passageways for injecting coolant onto the surface to be cooled, and a plurality of outlet passageways for exhausting coolant after impinging on the surface to be cooled. The plurality of inlet passageways and the plurality of outlet passageways are interleaved in the manifold structure for injecting coolant and exhausting coolant, respectively, through a common edge of the manifold structure. The manifold structure further includes a coolant inlet plenum and a coolant outlet plenum. Coolant passes into and through the plurality of inlet passageways from the coolant inlet plenum in a first direction perpendicular to the surface to be cooled, and coolant passes through the plurality of outlet passageways into the coolant outlet plenum in a second direction perpendicular to the surface to be cooled, wherein the first and second directions are opposite directions, and wherein the manifold structure, including the coolant inlet plenum and coolant outlet plenum, is contained within a rectangular volume defined by a projection of the common edge.

In a further aspect, a method of fabricating a cooling apparatus for cooling an electronic device is provided. The method includes: providing a manifold structure comprising a plurality of inlet passageways for injecting coolant onto a surface to be cooled, and a plurality of outlet passageways for exhausting coolant after impinging on the surface to be cooled, the plurality of inlet passageways and the plurality of outlet passageways being interleaved in the manifold structure, and injecting coolant and exhausting coolant, respectively, through a common edge of the manifold structure; and wherein the manifold structure further includes a coolant inlet plenum and a coolant outlet plenum, wherein when the cooling apparatus is in use, coolant passes through the plurality of inlet passageways from the coolant inlet plenum in a first direction perpendicular to the surface to be cooled, and coolant passes through the plurality of outlet passageways to the coolant outlet plenum in a second direction perpendicular to the surface to be cooled, the first and second directions being opposite directions, and wherein the manifold structure, including the coolant inlet plenum and coolant outlet plenum, is contained within a rectangular volume defined by a projection of the common edge.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 3A & 3B depict one embodiment of a first manifold plate type of the assembled plurality of manifold plates defining the manifold structure of the cooled electronic module of FIGS. 1-2, in accordance with an aspect of the present invention;

FIGS. 4A & 4B depict one embodiment of a second manifold plate type of the assembled plurality of manifold plates defining the manifold structure of the cooled electronic module of FIGS. 1-2, in accordance with an aspect of the present invention;

FIG. 8A is a cross-sectional elevational view of the cooled electronic module of FIG. 8, taken along line 8A-8A, in accordance with an aspect of the present invention;

FIG. 8B is a partially enlarged isometric view of the cooled electronic module of FIG. 8A, taken within line 8B, in accordance with an aspect of the present invention;

FIG. 8C is a cross-sectional elevational view of the cooled electronic module of FIG. 8, taken along line 8C-8C, in accordance with an aspect of the present invention;

FIG. 8D is a partially enlarged isometric view of the cooled electronic module of FIG. 8C, taken within line 8D, in accordance with an aspect of the present invention;

FIGS. 10A & 10B depict one embodiment of a first manifold plate type of the assembled plurality of manifold plates defining the manifold structure of the cooled electronic module of FIGS. 8-9, in accordance with an aspect of the present invention;

FIGS. 10C & 10D depict one embodiment of a second manifold plate type of the assembled plurality of manifold plates defining the manifold structure of the cooled electronic module of FIGS. 8-9, in accordance with an aspect of the present invention;

DETAILED DESCRIPTION OF THE INVENTION

Figure 1:
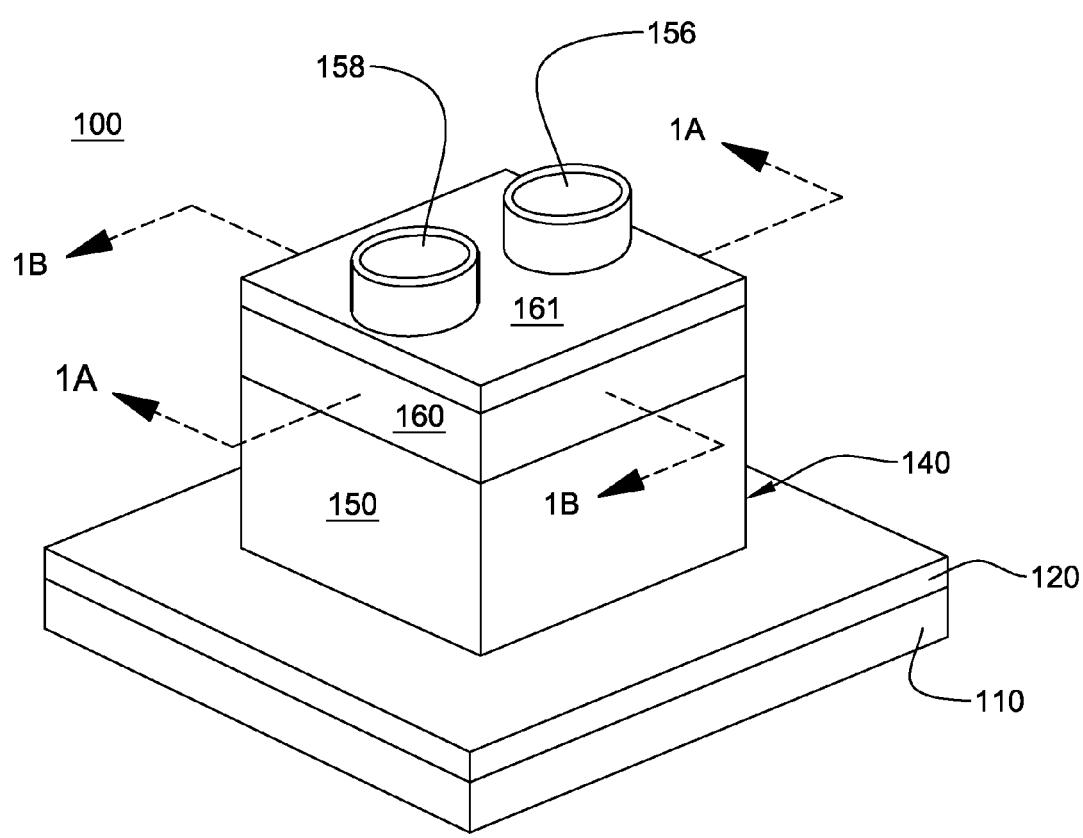
FIG. 1 is an isometric view of one embodiment of a cooled electronic module, in accordance with an aspect of the present invention.

As used herein "electronic device" comprises any heat generating electronic component of a computer system or other electronic system requiring cooling. In one example, the electronic device is or includes an integrated circuit chip, a semiconductor chip and/or an electronic component. The term "cooled electronic module" includes any electronic module with cooling and at least one electronic device, with single-chip modules and multi-chip modules being examples of a cooled electronic module as described herein. The "surface to be cooled" refers to a surface of the electronic device itself, or to an exposed surface of a thermal cap, thermal spreader, passivation layer, or other surface coupled to the electronic device (e.g., via a thermal interface material), and through which heat generated by the electronic device is to be extracted.

Generally stated, provided herein are an enhanced cooling apparatus and method of fabrication which allow for high heat transfer from a surface to be cooled using a direct (or indirect) liquid coolant impingement approach. In one embodiment, the cooling liquid may comprise a water-based, two-phase coolant. However, the concepts disclosed herein are readily adapted to use with other types of coolant, either two-phase or single-phase. For example, the coolant may comprise a brine, a fluorocarbon liquid, a liquid metal, or other similar coolant, or refrigerant, while still maintaining the advantages and unique features of the present invention.

Existing state-of-the-art single phase or two-phase liquid cooling cold plates have a number of drawbacks associated therewith, including, a typically high pressure drop in single phase structures due to a long flow length; a high pressure drop in two-phase structures resulting from localized vapor build-up; the occurrence of critical heat flux in two-phase devices due to localized vapor build-up (resulting in thermal runaway or high thermal resistance); a low to moderate cooling capability in single-phase mode at low pressure drop flow design points; and a plan area for the cooling apparatus which is often much larger than the electronic device to be cooled, leading to difficulty in accommodating adjacent non-liquid cooled electronics. The cooling apparatuses, cooled electronic modules and methods of fabrication disclosed herein overcome these disadvantages with existing state-of-the-art single and two-phase liquid cooling devices.

Referring first collectively to FIGS. 1, 1A, 1B & 2, one embodiment of a cooled electronic module 100 employing a cooling apparatus 140, in accordance with an aspect of the present invention, is illustrated. In this embodiment, cooled electronic module 100 includes a substrate 110, which may include conductive wiring (not shown) on an upper surface thereof and/or embedded therein. An electronic device 115 is electrically connected to the wiring of substrate 110 via, for example, solder ball connections (not shown). A sealing structure 120, which in one embodiment could comprise a plate with a center opening, facilitates isolation of the active circuit portion of electronic device 115 (as well as the connections and substrate surface metallurgy) from coolant within the module. A sealant 130, such as an epoxy, provides a fluid-tight seal between sealing structure 120 and electronic device 115. This hermetic seal is particularly desirable if the coolant is aqueous in nature.

The cooling apparatus 140 is spaced above an exposed surface to be cooled 116 of the electronic device 115 (e.g., the back surface of an integrated circuit chip) via appropriately dimensioned spacers 121 of the sealing structure 120 (or isolation plate), which define a separation gap 122 between an exposed common edge 600 (FIG. 6B) of a manifold structure 153 of the cooling apparatus and the exposed surface to be cooled 116 of the electronic device 115. This separation gap 122 defines the height of the slot jet impingement of coolant onto the surface to be cooled. Cooling apparatus 140 is joined to sealing structure 120 along the perimeter of the center opening exposing surface to be cooled 116, thereby ensuring that coolant leaving the manifold structure impinges upon the surface to be cooled and returns directly thereafter via the manifold structure.

As shown, the cooling apparatus 140 includes an assembled plurality of manifold plates (which define the manifold structure 153), an enclosing structure 150, a manifold plenum separator 160 and a manifold cover 161. Manifold plenum separator 160 isolates the inlet and outlet plenums of manifold structure 153. The manifold cover 161 includes at least one coolant inlet port 156 and at least one coolant outlet port 158, which are to be coupled to coolant-carrying tubing (not shown). Coolant enters and exits the cooling apparatus via the at least one coolant inlet port 156 and the at least one coolant outlet port 158, respectively. Cooling apparatus 140 is sealed to sealing structure 120 via a fluid-tight seal. Additionally, a fluid-tight seal is formed between enclosing structure 150 and manifold structure 153, as well as between manifold plenum separator 160 and enclosing structure 150 and between manifold cover 161 and manifold plenum separator 160. The fluid-tight seals could be metallurgical joints formed, for example, by soldering, brazing or welding, or could be adhesive joints formed, for example, employing epoxy, silicone, glue, etc. When assembled, the cooled electronic module shown in FIG. 1 has (in one example), a 14 mm×14 mm footprint, and is 12 mm tall. The electronic device being cooled has a 12 mm×12 mm footprint, and the cooling apparatus occupies almost the same footprint as the surface to be cooled of the electronic device, making the cooled electronic module very compact from a planar footprint point of view.

As shown (in one embodiment), manifold structure 153 and manifold plenum separator 160 define a coolant inlet plenum 155 and a coolant outlet plenum 157. Coolant inlet plenum 155 receives coolant via the at least one coolant inlet port 156, and provides coolant to a plurality of coolant inlet passageways 151 which extend between the coolant inlet plenum and the exposed common edge of manifold structure 153. Similarly, coolant outlet plenum 157 is in fluid communication with a plurality of coolant outlet passageways 152 extending from the exposed common edge of the manifold structure to the coolant outlet plenum, from which exhausted coolant exits through the at least one coolant outlet port 158 in manifold cover 161. The plurality of inlet passageways 151 inject coolant onto the surface to be cooled in the slot jet impingement region defined between the exposed common edge of the manifold structure and the surface to cooled. The impinging coolant strikes the surface to be cooled and turns 180° for return through the plurality of coolant outlet passageways 152.

As explained further below in connection with FIGS. 3A-7, manifold structure 153 comprises alternating inlet and outlet passageways 151, 152 defined by an assembled plurality of manifold plates. The assembled plurality of manifold plates comprises, in one embodiment, interleaved manifold plates of a first basic manifold plate type and a second basic manifold plate type.

The plurality of coolant inlet passageways 151 extending to the common edge of the manifold structure define a plurality of rectangular-shaped inlet slots in the common edge, and the plurality of outlet passageways 152 extending from the common edge of the manifold structure define a plurality of rectangular-shaped outlet slots in the common edge, wherein the inlet slots and the outlet slots are interleaved and parallel (in one embodiment) within the common edge of the manifold structure. The plurality of coolant return passageways of the manifold structure allow coolant to immediately leave the vicinity of the surface to be cooled after cooling the surface via slot jet impingement. This is illustrated by the directional arrow flows in FIGS. 1A & 1B, wherein coolant expelled through the inlet slots (i.e., jet orifices) impinges on the surface to be cooled and is turned by the surface to be cooled 180° and withdrawn through the outlet slots in fluid communication with the plurality of outlet passageways 152.

Advantageously, this manifold structure reduces pressure drop through the manifold, especially for two-phase designs, and allows exhaust coolant (liquid or vapor) to immediately exit after cooling the surface to be cooled. Further, a lower coolant temperature across the surface to be cooled in a single-phase system, and a reduced vapor build-up in a two-phase system, is achieved, thus increasing the maximum allowable device heat flux. In addition, a relatively uniform heat transfer coefficient on the surface to be cooled is achieved, and the footprint of the cooling apparatus over the substrate is minimally larger than the electronic device.

FIGS. 3A-7 depict fabrication of a manifold structure comprising an assembled plurality of manifold plates, in accordance with an aspect of the present invention.

Figure 1A:
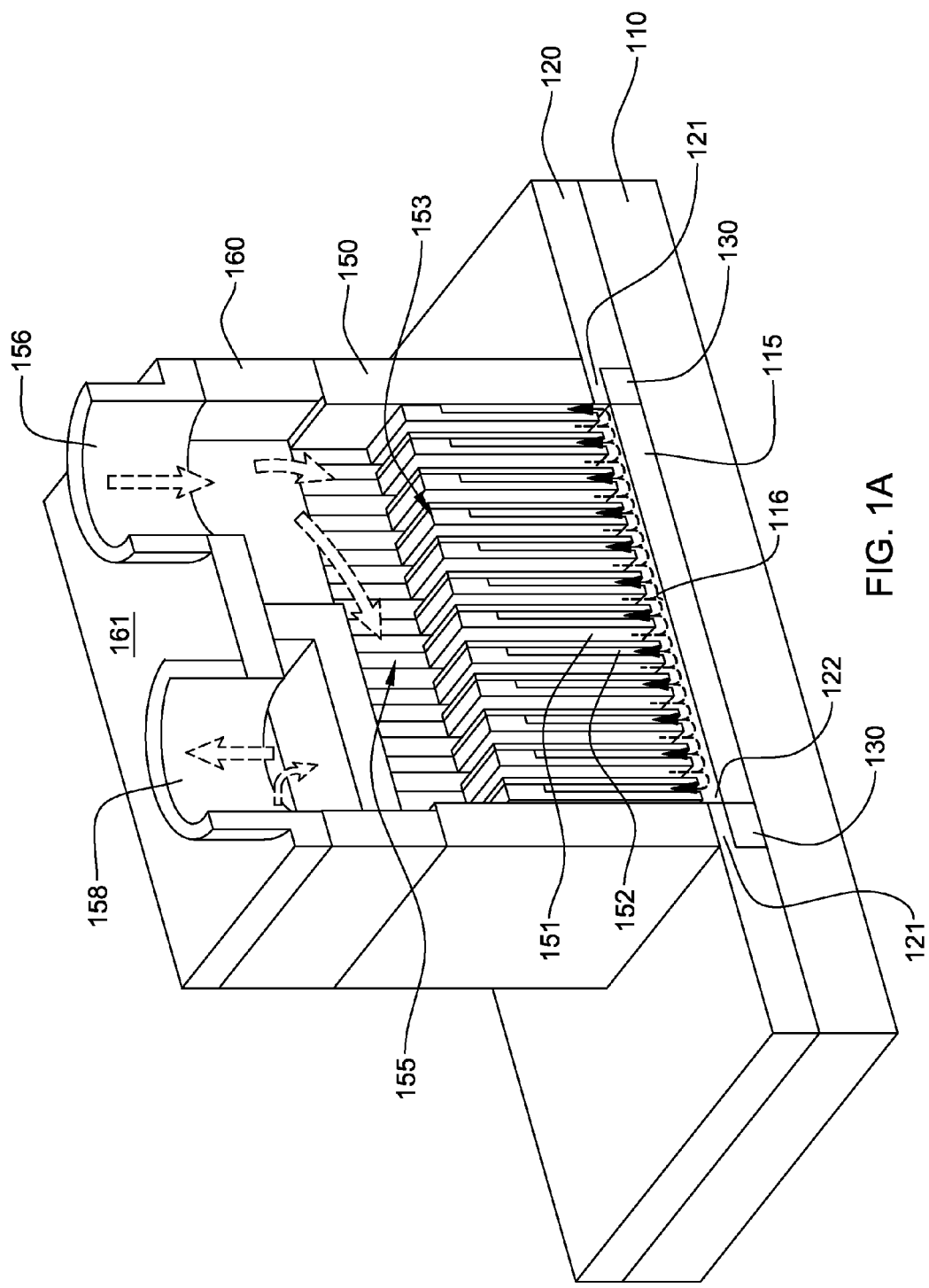
FIG. 1A is a cross-sectional elevational view of the cooled electronic module of FIG. 1, taken along line 1A-1A, in accordance with an aspect of the present invention.
Figure 1B:
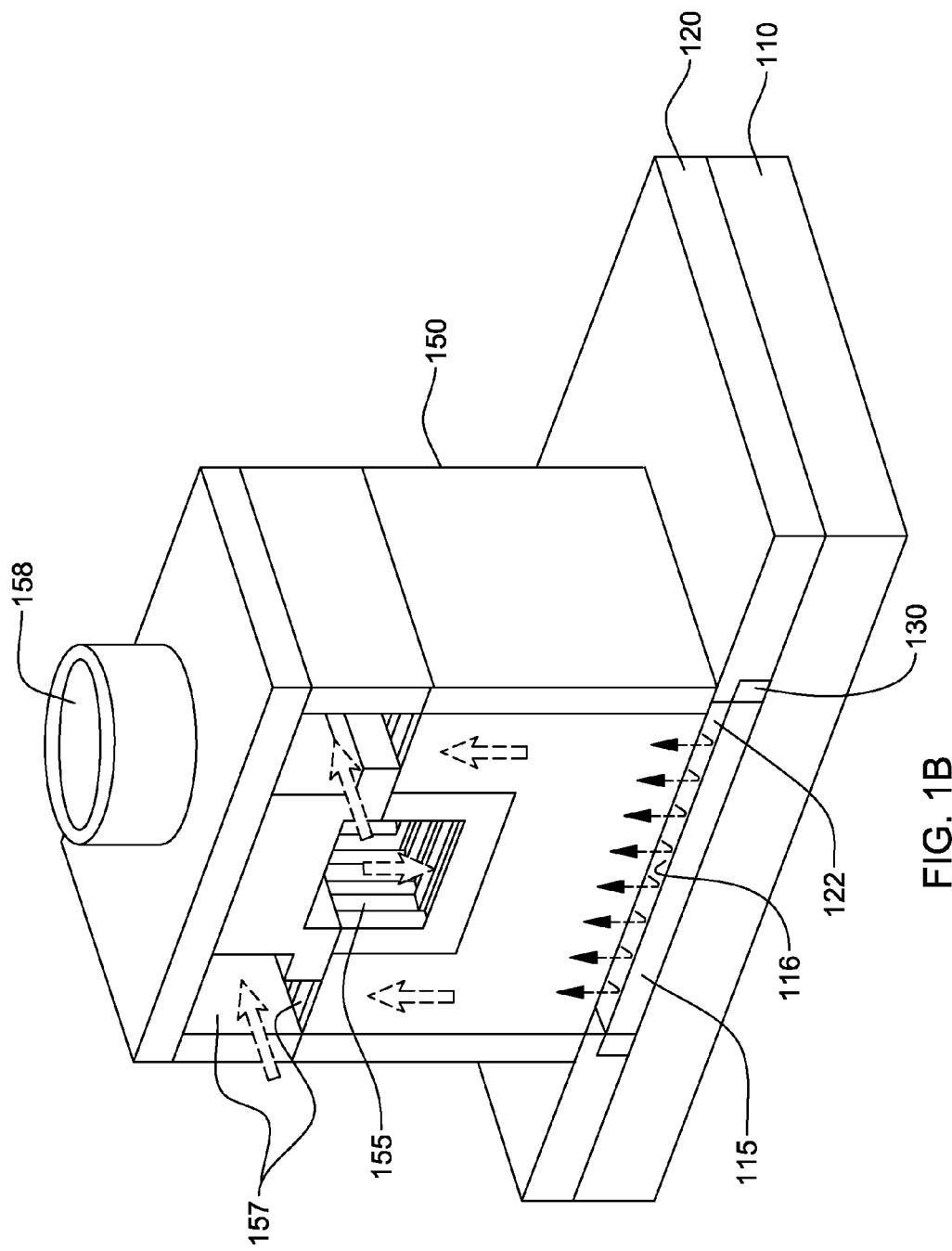
FIG. 1B is a cross-sectional elevational view of the cooled electronic module of FIG. 1, taken along line 1B-1B, in accordance with an aspect of the present invention.
Figure 2:
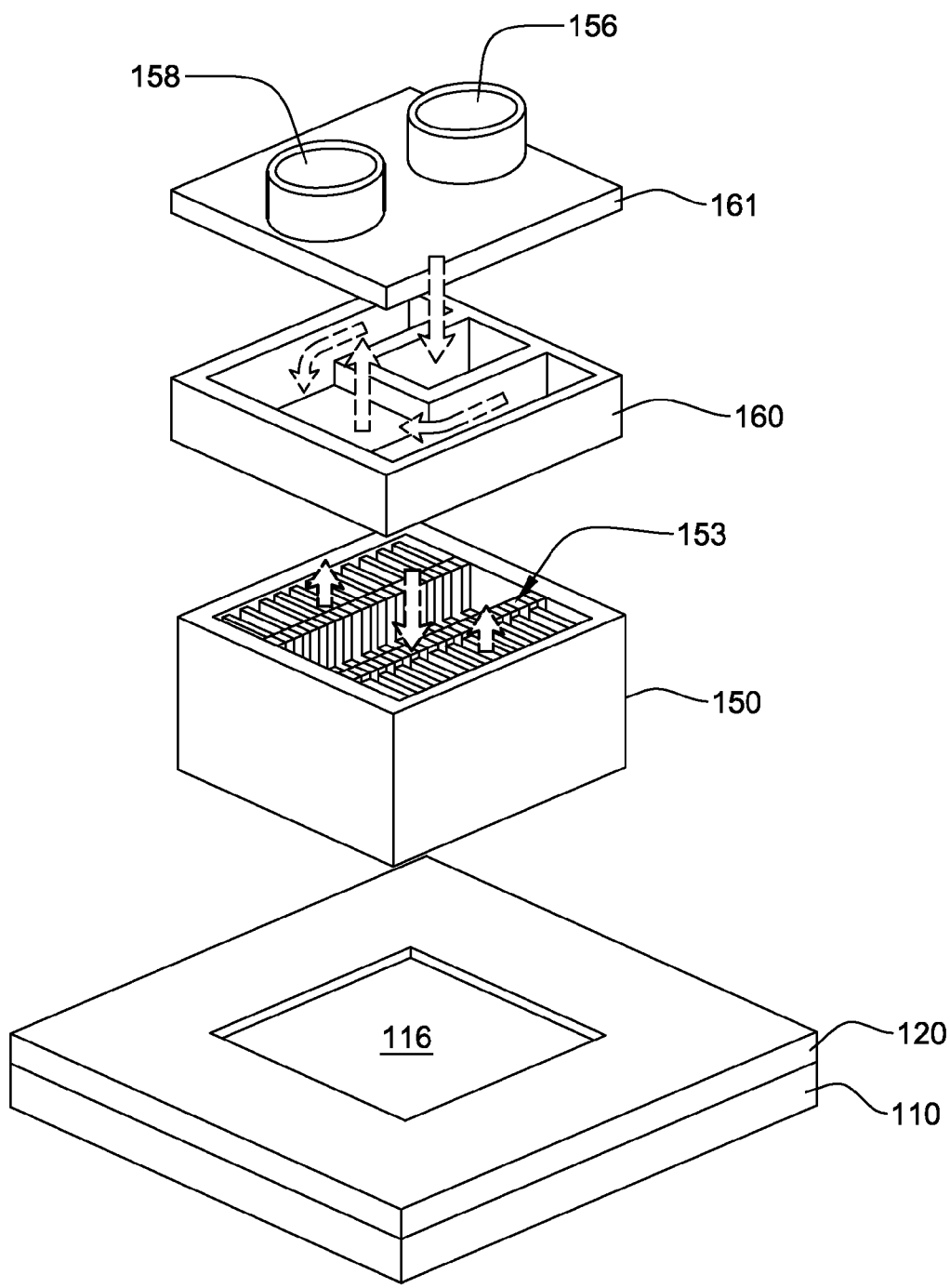
FIG. 2 is a partially exploded isometric view of the cooled electronic module of FIG. 1, in accordance with an aspect of the present invention.

FIGS. 3A & 3B illustrate one embodiment of a first manifold plate 300 employed in the assembled plurality of manifold plates defining the manifold structure 153 of FIGS. 1-2. First manifold plate 300 includes a coolant inlet passage face 301, forming a portion of a corresponding coolant inlet passageway (not shown), and a coolant outlet passage face 302 forming a portion of a corresponding coolant outlet passageway (not shown) of the manifold structure. L-shaped stand-offs 303 create the spacing needed to define the corresponding coolant inlet passageway. Additionally, stand-offs 303 separate the coolant inlet passageway from a corresponding portion of the outlet plenum defined in part via recesses 315 (or alternatively cutouts) in the first manifold plate 300. An opening 310 is provided intermediate the side edges of the first manifold plate. This opening 310 aligns with other openings of the manifold plates, which when assembled, define (in this embodiment) inlet plenum 155 as shown in FIGS. 1A & 1B.

By way of specific example, first manifold plate 300 is one of two basic plate types for the assembled plurality of manifold plates. This plate is a rectangular volume of metal material formed using stamping, skiving, or other similar manufacturing process. In the embodiment illustrated, opening 310 is a rectangular-shaped cutout, which when aligned with other manifold plates creates the inlet plenum. Those skilled in the art will note that other cutout designs can be employed. In this embodiment, outlet passage face 302 is planar, while inlet passage face 301 has two L-shaped stand-offs 303. These stand-offs are symmetric about a vertical axis. As noted, inlet passage face 301 forms one wall of a corresponding inlet passageway, and outlet passage face 302 forms one wall of a corresponding outlet passageway.

FIGS. 4A & 4B depict one embodiment of a second manifold plate 400 employed in the assembled plurality of manifold plates defining the manifold structure of FIGS. 1-2. This second manifold plate 400 includes a coolant outlet passage face 401, which defines a portion of a corresponding coolant outlet passageway (not shown), and a coolant inlet passage face 402, which defines a portion of a corresponding coolant inlet passageway (not shown). In this embodiment, a U-shaped stand-off 403 is provided to create the spacing needed to define the corresponding outlet passageway. The U-shaped stand-off 403 includes a centrally disposed opening 410 which aligns with the centrally disposed opening 310 in the first manifold plate 300 of FIG. 3A, and as noted, defines in part (in one embodiment) inlet plenum 155 of the manifold structure. Edge cutouts 415 are provided in the second manifold plate 400 intersecting the upper edge thereof. These cutouts 415 are sized to align with recesses 315 in the first manifold plate, and together define a portion of the coolant outlet plenum 157.

Second manifold plate 400 is the second basic plate type of the assembled plurality of manifold plates defining the manifold structure 153. Second manifold plate 400 is also fabricated from a metallic rectangular-shaped volume of material using stamping, skiving, etc., and includes a rectangular-shaped cutout 410 which assist in defining the inlet plenum. The U-shaped stand-off 403 facilitates creating the corresponding outlet passageway for the coolant return. The upper corners of second manifold plate 400 are cut out 415 to provide for regions of the outlet plenum as discussed herein.

As noted, the first manifold plates and second manifold plates of the assembled plurality of manifold plates can be fabricated by machining metal plates into the configurations illustrated in FIGS. 3A-4B. Those skilled in the art should note, however, that the geometry and thickness of one or more of the assembled plates can vary, as well as the depth and configuration of the openings, recesses and stand-offs provided therein, all without departing from the scope of the present invention. In one implementation, the metal plates might comprise stainless steel or copper. After machining a plurality of these plates, for example, by skiving or etching, the plates are assembled as illustrated in FIGS. 5A-6B.

Figure 5A:
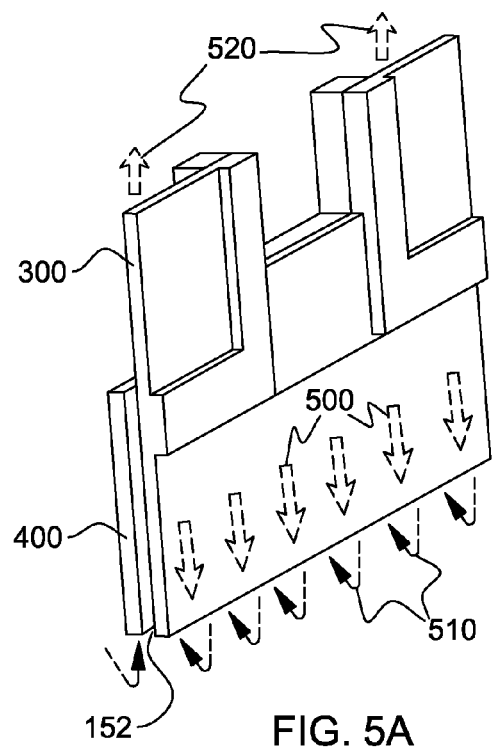
FIGS. 5A & 5B depict paired first and second manifold plates metallurgically bonded together to form a portion of the assembled plurality of manifold plates defining the manifold structure of the cooled electronic module of FIGS. 1-2, in accordance with an aspect of the present invention.
Figure 5B:
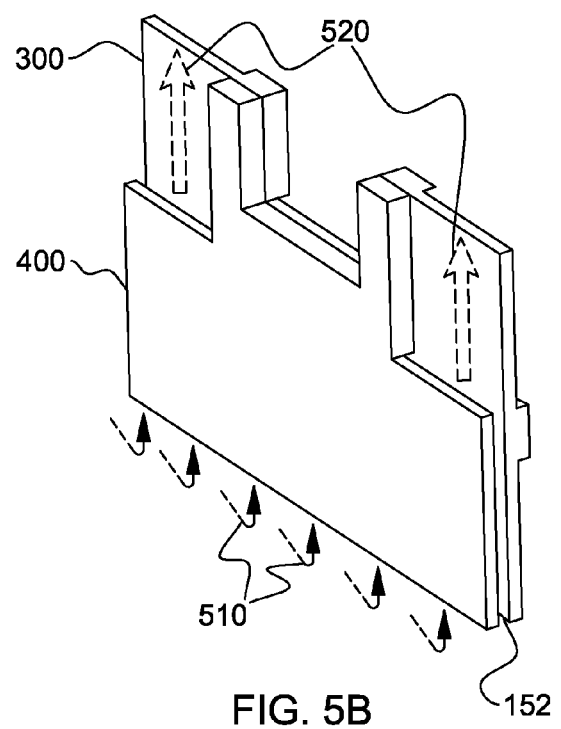

FIGS. 5A & 5B illustrate a first manifold plate 300 and second manifold plate 400 pair metallurgically bonded together, for example, by soldering the stand-offs 403 of the second manifold plate 400 to the coolant outlet passage face 302 of the first manifold plate. In FIG. 5A, coolant flow from the inlet plenum is shown in a first direction 500 through an adjacent inlet passageway (which as noted, is to be disposed substantially perpendicular to the surface to be cooled). After impinging on the surface to be cooled (not shown), the coolant turns 180° as illustrated by arrows 510 and is exhausted through an outlet passageway 152 defined between the first manifold plate 300 and second manifold plate 400. Coolant exits through the outlet passageway in a direction also substantially perpendicular to the surface to be cooled (not shown), but 180° from the direction of the inlet coolant impinging upon the surface to be cooled.

As noted, inlet passageways 151 and outlet passageways 152 introduce coolant in a first direction 500 perpendicular to the surface to be cooled when the cooling apparatus is in use, and return coolant in a second direction 520, also perpendicular to the surface to be cooled, after impinging thereon. This orientation of the inlet and outlet passageways and the inlet and outlet plenums advantageously allows for a minimum footprint size for the cooling apparatus in that all coolant is introduced and exhausted directly over the surface to be cooled. Thus, the size of the cooling apparatus is commensurate (in this embodiment) with the exposed surface of the electronic device to be cooled. In this embodiment, inlet plenum 155 is principally disposed within the core manifold structure of the cooling apparatus, and outlet plenum 157 is positioned at the top along two edge surfaces of the core manifold structure. The two different plates 300, 400 are stacked in an alternating manner and joined using brazing, soldering, or comparable processes (e.g., diffusion bonding) to form an assembled plurality of manifold plates illustrated in FIGS. 6A & 6B.

The alternating stack of plates 300, 400 creates the interleaved inlet and outlet passageways described herein. In one specific example, eleven first manifold plates may be used in conjunction with twelve second manifold plates to create eleven inlet passageways and twelve outlet passageways. Chilled coolant entering through the inlet plenum splits into the eleven parallel inlet passageways and returns in parallel via the twelve outlet passageways. The manifold plates are bonded together, for example, metallurgically, at each of the contact surfaces. The contact surfaces are the planar surfaces of the stand-offs in the first manifold plate and second manifold plate. As a specific example, the manifold plates 300, 400 each have a thickness of 0.25 mm, and the stand-offs are 0.25 mm high. Thus, the inlet and outlet passageways are both 0.25 mm wide and, in one embodiment, 12 mm deep. The separation between the surface to be cooled and the common edge of the manifold structure depicted in FIGS. 1-7 is, in one example, 0.5 mm. This separation is the height of the slot jet that impinges on the surface to be cooled. By way of further example, the inlet and outlet ports depicted in FIGS. 1-2 have an outside diameter of 5 mm.

Figure 6A:
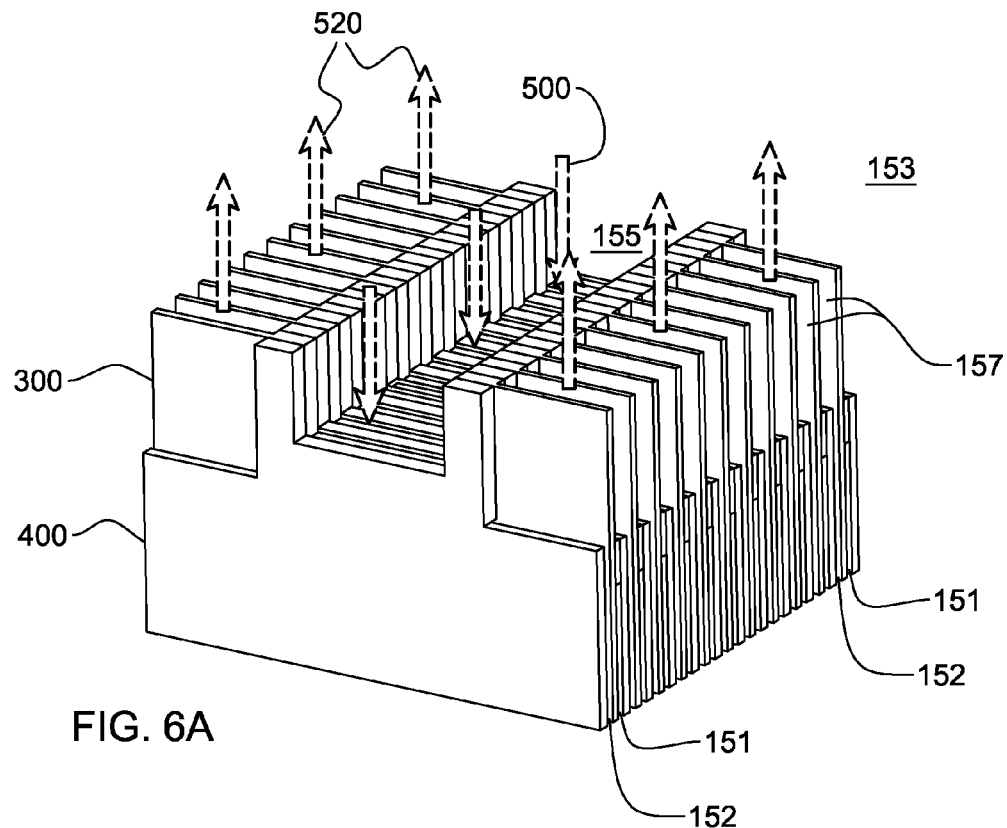
FIGS. 6A & 6B depict one embodiment of the assembled plurality of manifold plates defining the manifold structure of the cooled electronic module of FIGS. 1-2, in accordance with an aspect of the present invention.
Figure 6B:
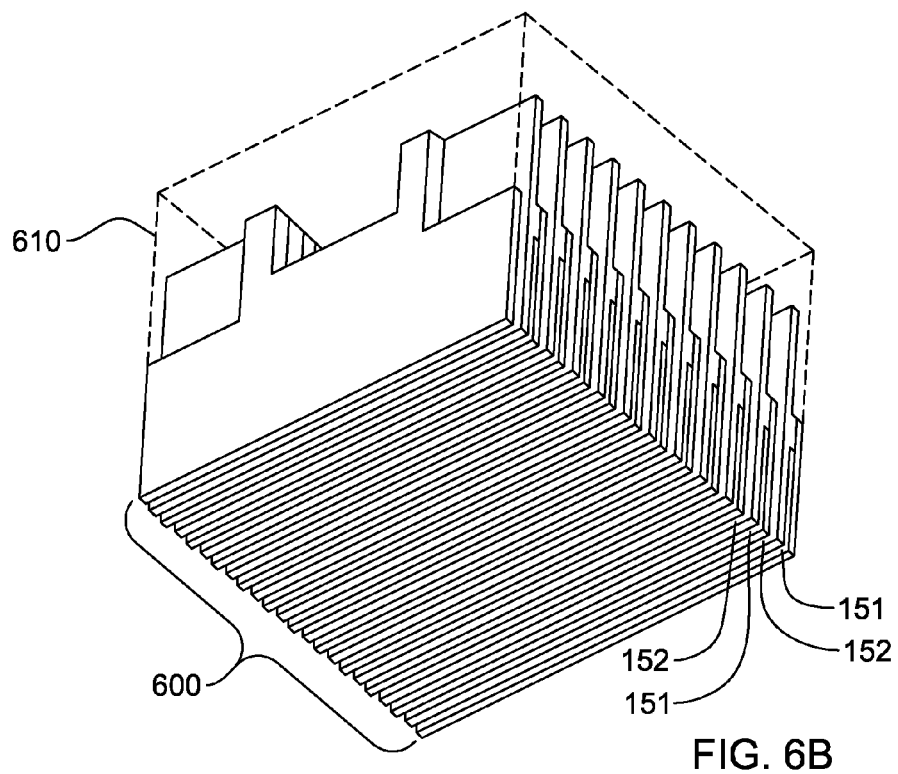

As shown in FIG. 6B, the common edge 600 of core manifold structure 153 is a rectangular-shaped edge formed by aligned first edges of the assembled plurality of manifold plates. Advantageously, as shown in this figure, the manifold structure, including the coolant inlet plenum and coolant outlet plenum, is fully contained within a rectangular volume 610 defined by a vertical projection of the common edge 600. Thus, the inlet and outlet plenums, as well as the inlet and outlet passageways connecting the inlet and outlet plenums to the common edge, do not extend outside the footprint of the common edge and reside entirely thereabove. Further, although heated coolant bifurcates within the outlet passageways of the manifold structure to exit into the outlet plenum, the heated coolant exits into the outlet plenum in the second direction 520 perpendicular to the surface to be cooled and within the confines of the rectangular volume 610 defined by the projection of the common edge.

Figure 7:
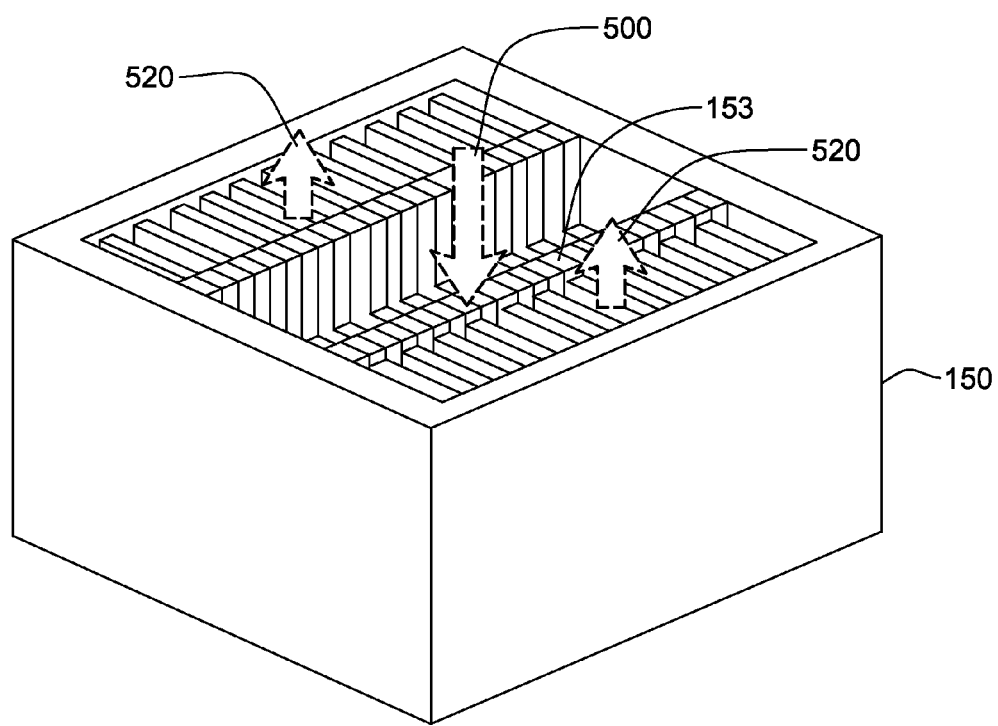
FIG. 7 is an isometric view of the manifold structure of FIGS. 6A & 6B, partially surrounded by an enclosing structure metallurgically bonded to side edges thereof during fabrication of the cooled electronic module of FIGS. 1-2, in accordance with an aspect of the present invention.

FIG. 7 depicts the manifold structure 153 encircled by enclosing structure 150, which in one embodiment is metallurgically bonded to manifold structure 153. Again, as illustrated, coolant flow 500 from the inlet plenum is downwards, while coolant flow into the outlet plenum is upwards, both directions being orthogonal to the surface to be cooled. The lower, common edge 600 (see FIG. 6B) of the core manifold structure in this implementation remains exposed and is sized to align with an exposed portion of the surface to be cooled.

An alternate embodiment of a cooled electronic module, in accordance with aspects of the present invention, is depicted in FIGS. 8-12. Unless otherwise specified, the configuration, materials and fabrication of this cooled electronic module are the same or similar to those described above in connection with the cooled electronic module of FIGS. 1-7.

Figure 8:
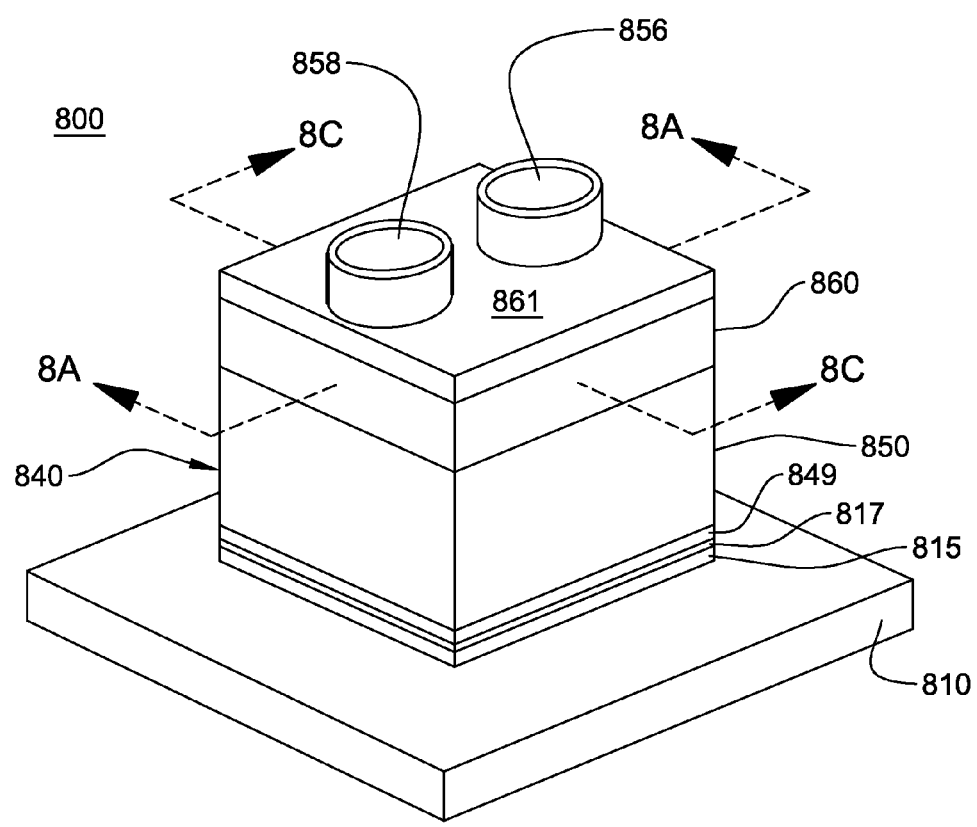
FIG. 8 is an isometric view of an alternate embodiment of a cooled electronic module, in accordance with an aspect of the present invention.
Figure 9:
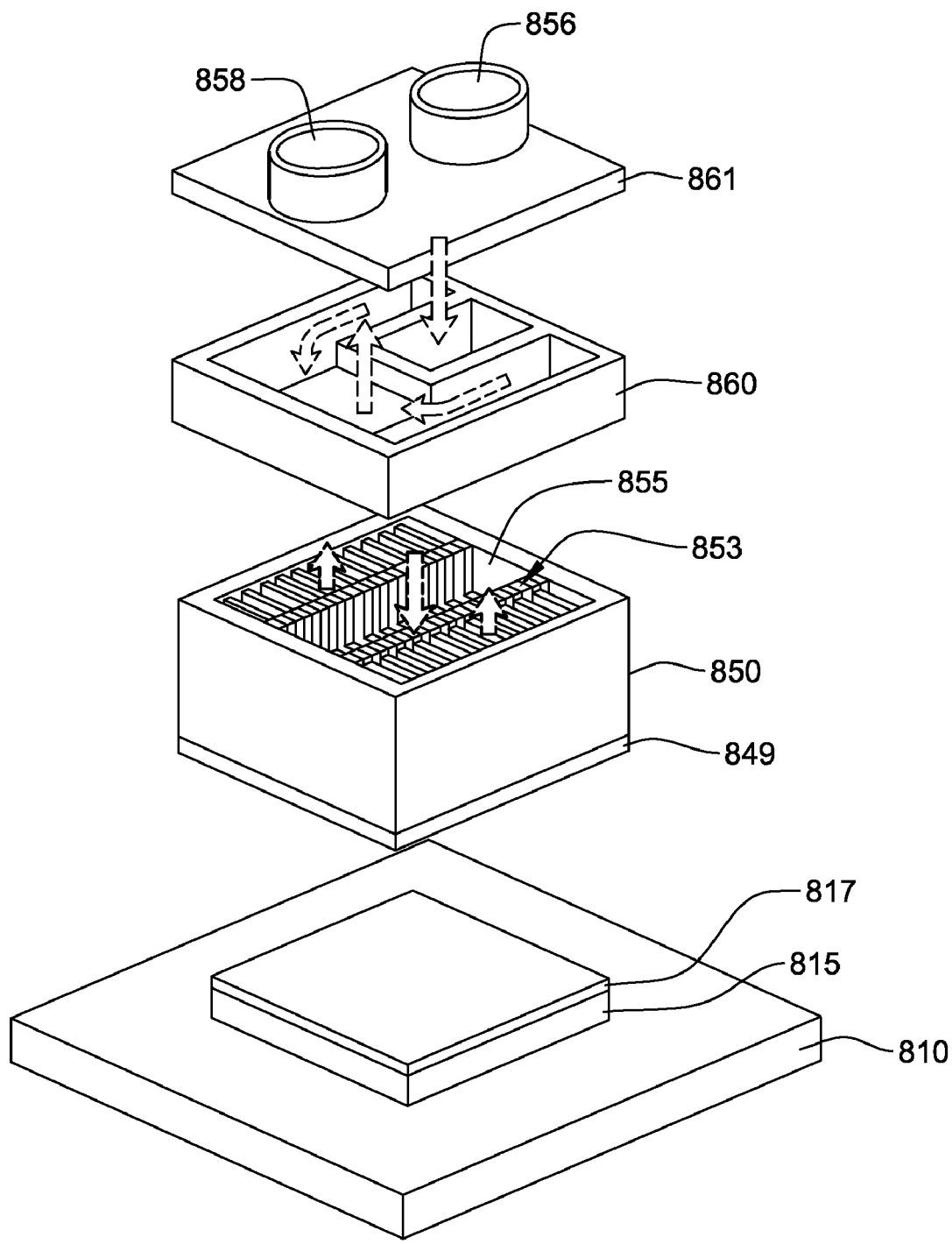
FIG. 9 is a partially exploded isometric view of the cooled electronic module of FIG. 8, in accordance with an aspect of the present invention.

Referring first collectively to FIGS. 8-9, this cooled electronic module 800 comprises a cooling apparatus 840 supported by a substrate 810, which also supports an electronic device 815. Substrate 810 may include conductive wiring (not shown) on an upper surface thereof and/or embedded therein. Electronic device 815 can be electrically connected to the wiring of substrate 810 via, for example, solder ball connections.

Cooling apparatus 840 includes a manifold structure 853, which again comprises an assembled plurality of manifold plates. An enclosing structure 850 at least partially surrounds manifold structure 853 and, in one embodiment, is metallurgically bonded to the side edges of the manifold structure. Enclosing structure 850 includes a base plate 849 (i.e., a high performance cold plate) which is sized to align to a surface to be cooled 816 of the electronic device 815. Thus, this cooled electronic module employs a liquid-cooled cold plate approach to removing heat from the electronic device, which is contrasted with the direct liquid jet-impingement approach of the cooled electronic module described above in connection with FIGS. 1-7. In the embodiment of FIGS. 8-9, the liquid jet-impingement is on a surface to be cooled of base plate 849, which is thermally coupled via a thermal interface material 817 to the heat generating electronic device 815.

As shown, cooling apparatus 840 further includes a manifold plenum separator 860 and a manifold cover 861 comprising at least one coolant inlet port 856 and at least one coolant outlet port 858. Soldering or brazing may be employed to seal base plate 849 to enclosing structure 850 and to manifold structure 853 (described further below), as well as manifold plenum separator 860 to enclosing structure 850, and manifold cover 861 to manifold plenum separator 860.

In this embodiment, the core manifold structure is shown to comprise an assembled plurality of manifold plates (again assembled from manifold plates of alternating first and second type), which define alternating inlet and outlet passageways 851, 852. The plurality of inlet passageways 851 extend within the manifold structure to a common edge, which in this embodiment is a lower surface of the assembled manifold plates that is metallurgically bonded to thermally conductive base plate 849.

The inlet and outlet passageways are again interleaved within the manifold structure, with inlet coolant passing through the inlet passageways to impinge upon base plate 849 perpendicular to the surface to be cooled, and for exhausting coolant after impinging on the surface to be cooled via the outlet passageways 852, again within the manifold structure in a direction perpendicular to the surface to be cooled. As in the cooled electronic module embodiment of FIGS. 1-7, the first direction and second direction of the inlet coolant and outlet coolant are opposite directions.

As best shown in FIGS. 8B & 8D, the aligned edges of the plurality of manifold plates forming the common edge coupled to the base plate of the enclosing structure each include a plurality of thermally conductive fin structures 870 formed, for example, by machining or etching of the respective manifold plate edges. Thermally conductive fin structures 870 within each manifold plate are spaced to define coolant flow-through channels 871 therebetween to further facilitate transfer of heat from the thermally conductive fin structures to the injected coolant. In one embodiment, fin structures 870 are metallurgically bonded to thermally conductive base plate 849. Metallurgical bonding refers to, for example, soldering, brazing or welding, wherein a low thermal resistance joint is formed between each thermally conductive fin structure and the large cross-sectional area of the base plate.

One embodiment of the different manifold plates employed in the manifold structure illustrated in FIGS. 8-9 is depicted in FIGS. 10A-12 and described below.

FIGS. 10A & 10B show one embodiment of a first manifold plate 1000 employed in the assembled plurality of manifold plates comprising the manifold structure 853. First manifold plate 1000 includes a coolant inlet passage face 1001, forming a portion of a corresponding coolant inlet passageway (not shown), and a coolant outlet passage face 1002 forming a portion of a corresponding coolant outlet passageway (not shown) of the manifold structure. L-shaped stand-offs 1003 create spacing needed to define the corresponding coolant inlet passageway. Additionally, stand-offs 1003 separate the coolant inlet passageway from a corresponding portion of the outlet plenum defined in part by recesses 1015 (or alternatively, cutouts) in the first manifold plate 1000. An opening 1010 is provided in the top edge of the plate intermediate the side edges thereof. This opening aligns with other similarly configured openings in the manifold plates, which together when assembled define coolant inlet plenum 855 (shown in FIGS. 8-9).

FIGS. 10C & 10D depict one embodiment of a second manifold plate 1050 employed in the assembled plurality of manifold plates defining the manifold structure depicted in FIGS. 8-9. This second manifold plate 1050 includes a coolant outlet passage face 1051, which defines a portion of a corresponding coolant outlet passageway (not shown), and a coolant inlet passage face 1052, which defines a portion of a corresponding coolant inlet passageway (not shown). In this embodiment, a U-shaped stand-off 1053 is provided to create the spacing needed to define a corresponding coolant outlet passageway. The U-shaped stand-off 1053 includes a centrally disposed opening 1060 in the top edge of the plate which aligns with opening 1010 of the first manifold plate 1000 of FIGS. 10A & 10B, and as noted, defines (in one embodiment) the coolant inlet plenum of the manifold structure. Side edge cutouts 1065 are provided in second manifold plate 1050 intersecting the top edge thereof. These cutouts 1065 are sized similarly to recesses 1015 in the first manifold plate. Together, the cutouts and recesses define portions of the coolant outlet plenum 857.

Figure 11:
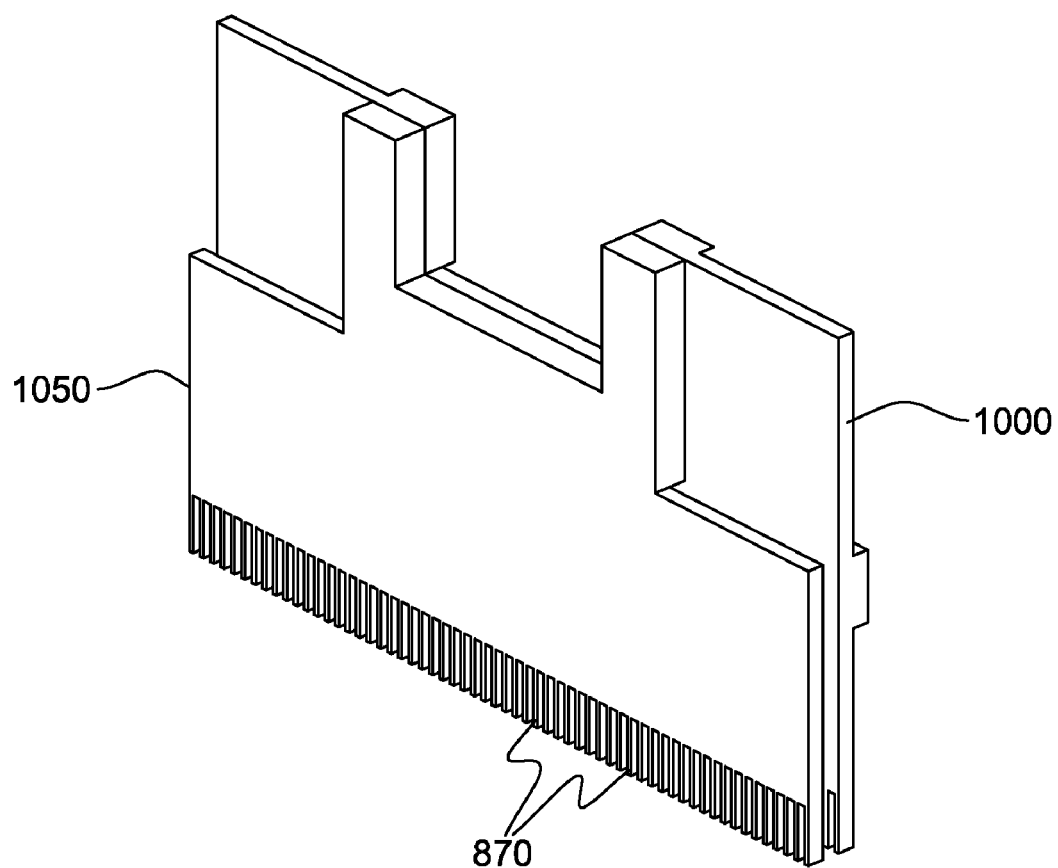
FIG. 11 is an isometric view of a first manifold plate and second manifold plate metallurgically bonded together to form a portion of the manifold structure of the cooled electronic module of FIGS. 8-9, in accordance with an aspect of the present invention.

FIG. 11 illustrates a first manifold plate 1000 and second manifold plate 1050 pair metallurgically bonded together, for example, by soldering stand-off 1053 of second manifold plate 1050 to the coolant outlet passage face 1002 of the first manifold plate. The etched or machined thermally conductive fin structures 870 are again illustrated. These fin structures are provided to facilitate heat transfer from the thermally conductive base plate of the enclosing structure to the manifold plates of the assembled plurality of manifold plates defining the manifold structure and to the liquid coolant passing therethrough.

Figure 12:
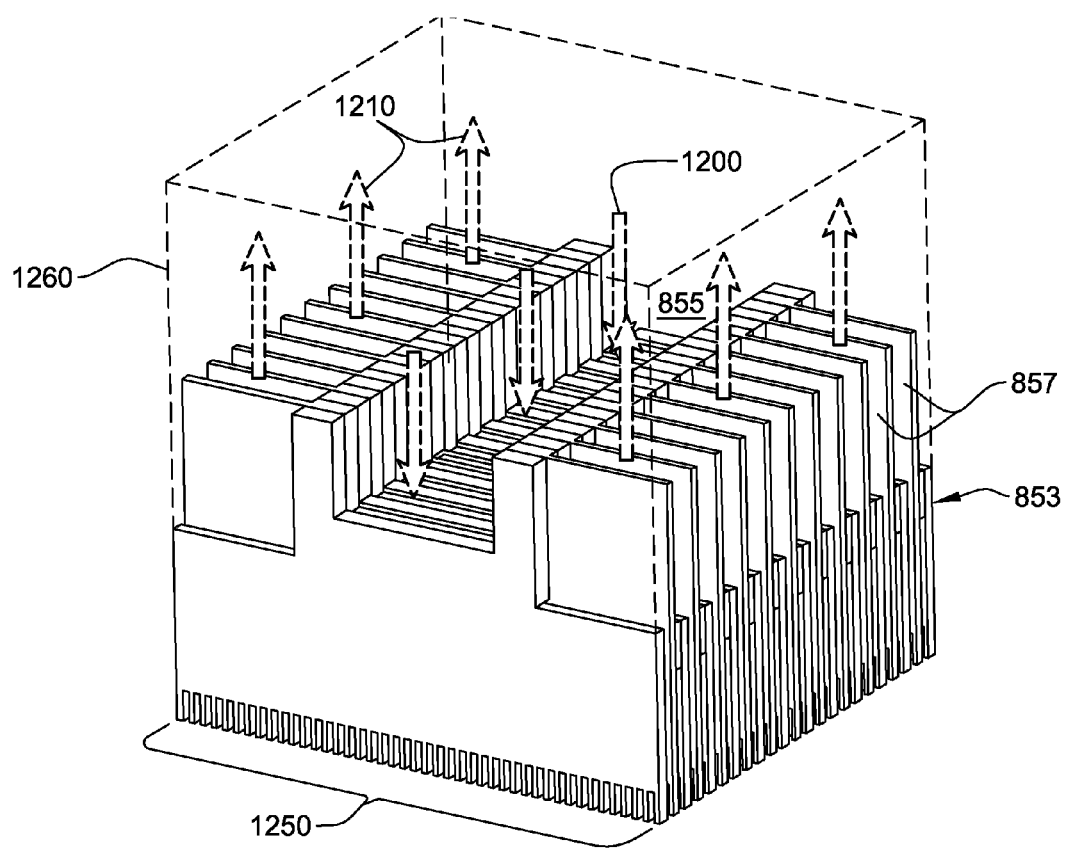
FIG. 12 is an isometric view of one embodiment of the assembled plurality of manifold plates defining the manifold structure of the cooled electronic module of FIGS. 8-9, in accordance with an aspect of the present invention.

As shown in FIG. 12, the inlet and outlet passageways of manifold structure 853 are disposed such that coolant flows from inlet plenum 855 in a first direction 1200 for impingement on a surface to be cooled. In this embodiment, the surface to be cooled is a surface of the enclosing structure's base plate that is thermally coupled to the electronic device to be cooled. Additionally, coolant returns via the coolant outlet passageways of the manifold structure and the coolant outlet plenum in a second direction 1210. As shown, first direction 1200 and second direction 1210 are each perpendicular to the surface to be cooled, but opposite directions.

As also shown in FIG. 12, the manifold structure 853 resides entirely within a rectangular volume 1260 defined by a vertical projection of the surface area of the common edge 1250 defined by the aligned, thermally conductive fin structures 870 of the assembled manifold plates. Thus, the inlet and outlet plenums, as well as the inlet and outlet passageways connecting the inlet and outlet plenums to the common edge of the manifold structure, do not extend outside of the footprint of the common edge, and hence reside entirely thereabove. This advantageously minimizes the footprint of the cooling apparatus used to actively cool the electronic device. Further, the depicted manifold structure reduces pressure drop through the manifold, especially for two-phase designs, and allows for exhaust coolant (liquid or vapor) to immediately exit after cooling the surface to be cooled. A lower cooling temperature across the surface to be cooled in a single-phase system is achieved, as well as reduced vapor build-up in a two-phase system, thus increasing the maximum allowable device heat flux. Further, a relatively uniform heat transfer coefficient on the surface to be cooled is achieved by disposing the plurality of inlet passageways and the plurality of outlet passageways across the surface to be cooled.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus comprising:
   a manifold structure comprising a plurality of inlet passageways for impinging coolant onto a surface to be cooled, and a plurality of outlet passageways for exhausting coolant after impinging on the surface to be cooled, the inlet passageways and the outlet passageways being interleaved in the manifold structure over the surface to be cooled for injecting coolant onto and exhausting coolant from, respectively, the surface to be cooled through a common edge of the manifold structure, the interleaved inlet and outlet passageways comprising alternating inlet and outlet passageways at the common edge of the manifold structure, and the common edge of the manifold structure being in opposing relation to the surface to be cooled; and
   wherein the manifold structure further comprises a coolant inlet plenum and a coolant outlet plenum, with coolant passing through the plurality of inlet passageways from the coolant inlet plenum in a first direction perpendicular to the surface to be cooled, and coolant passing through the plurality of outlet passageways to the coolant outlet plenum in a second direction perpendicular to the surface to be cooled, the first and second directions being opposite directions, and wherein the manifold structure, including the coolant inlet plenum and coolant outlet plenum, is contained within a rectangular volume defined by a projection of the common edge; and
   wherein the manifold structure comprises an assembled plurality of manifold plates, at least some manifold plates of the assembled plurality of manifold plates comprising stand-offs, the stand-offs defining in part the plurality of inlet passageways and the plurality of outlet passageways of the manifold structure.

2. The cooling apparatus of claim 1, wherein the plurality of inlet passageways extend to the common edge of the manifold structure and define a plurality of coolant inlet slots in the common edge for injecting coolant onto the surface to be cooled, and wherein the plurality of outlet passageways extend to the common edge of the manifold structure and define a plurality of coolant outlet slots in the common edge for exhausting coolant after impinging on the surface to be cooled, the plurality of coolant inlet slots and plurality of coolant outlet slots being interleaved in the common edge of the manifold structure, and wherein the common edge of the manifold structure is sized to align to an exposed portion of the surface to be cooled.

3. The cooling apparatus of claim 1, wherein the manifold plates of the assembled plurality of manifold plates have aligned first edges, the aligned first edges defining the common edge of the manifold structure, and the manifold plates comprise aligned openings in second edges thereof, the second edges being opposite the aligned first edges, and the aligned openings defining at least a portion of one of the coolant inlet plenum and the coolant outlet plenum.

4. The cooling apparatus of claim 3, wherein the aligned openings are disposed intermediate side edges of the assembled plurality of manifold plates and define at least a portion of the coolant inlet plenum, and wherein at least some manifold plates of the assembled plurality of manifold plates comprise one of edge cutouts or edge recesses intersecting the second edges thereof, the edge cutouts or edge recesses defining at least a portion of the coolant outlet plenum.

5. The cooling apparatus of claim 1, further comprising an enclosing structure metallurgically bonded to side edges of the manifold structure, and wherein the common edge of the manifold structure is exposed and sized for alignment to an exposed portion of the surface to be cooled.

6. The cooling apparatus of claim 1, wherein the manifold structure comprises an assembled plurality of manifold plates, the manifold plates of the assembled plurality of manifold plates having aligned first edges, the aligned first edges defining the common edge of the manifold structure, and wherein at least some first edges of the aligned first edges each comprise a plurality of thermally conductive fin structures.

7. The cooling apparatus of claim 6, further comprising an enclosing structure at least partially surrounding the manifold structure with the plurality of thermally conductive fin structures of the at least some first edges of the manifold plates metallurgically bonded to a base plate of the enclosing structure, the base plate being sized for alignment to an exposed portion of the surface to be cooled when the cooling apparatus is disposed in operational position with the base plate of the enclosing structure coupled via a thermal interface material to the exposed portion of the surface to be cooled.

8. A cooled electronic module comprising:
   a substrate;
   at least one heat generating electronic device to be cooled coupled to the substrate; and
   a cooling apparatus coupled to the at least one heat generating electronic device for cooling at least one surface to be cooled, the at least one surface to be cooled comprising at least one of a surface of the at least one heat generating electronic device or a surface coupled to the at least one heat generating electronic device, the cooling apparatus comprising:
      a manifold structure comprising a plurality of inlet passageways for impinging coolant onto the at least one surface to be cooled, and a plurality of outlet passageways for exhausting coolant after impinging on the at least one surface to be cooled, the inlet passageways and the outlet passageways being interleaved in the manifold structure over the at least one surface to be cooled and injecting coolant onto and exhausting coolant from, respectively, the at least one surface to be cooled through a common edge of the manifold structure, the interleaved inlet and outlet passageways comprising alternating inlet and outlet passageways at the common edge of the manifold structure, and the common edge being disposed in opposing relation to the at least one surface to be cooled; and wherein the manifold structure further comprises a coolant inlet plenum and a coolant outlet plenum, with coolant passing into and through the plurality of inlet passageways from the coolant inlet plenum in a first direction perpendicular to the at least one surface to be cooled and coolant passing through the plurality of outlet passageways into the coolant outlet plenum in a second direction perpendicular to the at least one surface to be cooled, the first and second directions being opposite directions, and wherein the manifold structure, including the coolant inlet plenum and coolant outlet plenum, is contained within a rectangular volume defined by a projection of the common edge; and wherein the manifold structure comprises an assembled plurality of manifold plates, at least some manifold plates of the assembled plurality of manifold plates comprising stand-offs, the stand-offs defining in part the plurality of inlet passageways and the plurality of outlet passageways of the manifold structure.

9. The cooled electronic module of claim 8, wherein the plurality of inlet passageways extend to the common edge of the manifold structure and define a plurality of coolant inlet slots in the common edge for injecting coolant onto the at least one surface to be cooled, and wherein the plurality of outlet passageways extend to the common edge of the manifold structure and define a plurality of coolant outlet slots in the common edge for exhausting coolant after impinging on the at least one surface to be cooled, the plurality of coolant inlet slots and plurality of coolant outlet slots being interleaved in the common edge of the manifold structure, and wherein the common edge of the manifold structure is sized to align to an exposed portion of the surface to be cooled.

10. The cooled electronic module of claim 8, wherein the manifold plates of the assembled plurality of manifold plates have aligned first edges, the aligned first edges defining the common edge of the manifold structure, and the manifold plates comprise aligned openings in second edges thereof, the second edges being opposite the aligned first edges, and the aligned openings defining at least a portion of one of the coolant inlet plenum and the coolant outlet plenum.

11. The cooled electronic module of claim 10, wherein the aligned openings are disposed intermediate side edges of the assembled plurality of manifold plates and define at least a portion of the coolant inlet plenum, and wherein at least some manifold plates of the assembled plurality of manifold plates further comprise one of edge cutouts or edge recesses intersecting the second edges thereof, the edge cutouts or edge recesses defining at least a portion of the coolant outlet plenum.

12. The cooled electronic module of claim 8, wherein the cooling apparatus further comprises an enclosing structure metallurgically bonded to side edges of the manifold structure, and wherein the common edge of the manifold structure is exposed and sized for alignment to the at least one surface to be cooled.

13. The cooled electronic module of claim 8, wherein the manifold structure comprises an assembled plurality of manifold plates, the manifold plates of the assembled plurality of manifold plates having aligned first edges, the aligned first edges defining the common edge of the manifold structure, and wherein at least some first edges of the aligned first edges each comprise a plurality of thermally conductive fin structures.

14. The cooled electronic module of claim 13, wherein the cooling apparatus further comprises an enclosing structure at least partially surrounding the manifold structure with the plurality of thermally conductive fin structures of the at least some first edges of the manifold plates metallurgically bonded to a base plate of the enclosing structure, the base plate being sized to an exposed portion of the at least one surface to be cooled, and the cooling apparatus being disposed with the base plate of the enclosing structure coupled via a thermal interface material to the exposed portion of the at least one surface to be cooled.

15. A method of fabricating a cooling apparatus for cooling an electronic device, the method comprising:

providing a manifold structure comprising a plurality of inlet passageways for impinging coolant onto a surface to be cooled, and a plurality of outlet passageways for exhausting coolant after impinging on the surface to be cooled, the inlet passageways and the outlet passageways being interleaved in the manifold structure over the surface to be cooled, and injecting coolant onto and exhausting coolant from, respectively, the surface to be cooled through a common edge of the manifold structure, the interleaved inlet and outlet passageways comprising alternating inlet and outlet passageways at the common edge of the manifold structure, and the common edge of the manifold structure being in opposing relation to the surface to be cooled; and wherein the manifold structure further comprises a coolant inlet plenum and a coolant outlet plenum, wherein when the cooling apparatus is in use, coolant passes through the plurality of inlet passageways from the coolant inlet plenum in a first direction perpendicular to the surface to be cooled, and coolant passes through the plurality of outlet passageways to the coolant outlet plenum in a second direction perpendicular to the surface to be cooled, the first and second directions being opposite directions, and wherein the manifold structure, including the coolant inlet plenum and coolant outlet plenum, is contained within a rectangular volume defined by a projection of the common edge; and wherein the providing further includes providing the manifold structure as an assembled plurality of manifold plates, at least some manifold plates of the assembled plurality of manifold plates comprising stand-offs, the stand\-offs functioning to define in part the plurality of inlet passageways and the plurality of outlet passageways of the manifold structure, and wherein the manifold plates of the assembled plurality of manifold plates have aligned first edges, the aligned first edges defining the common edge of the manifold structure, and comprise aligned openings in second edges thereof, the second edges being opposite the aligned first edges, and the aligned openings defining at least a portion of the coolant inlet plenum, the aligned openings being disposed intermediate side edges of the assembled plurality of manifold plates, and wherein at least some manifold plates of the assembled plurality of manifold plates comprise one of edge cutouts or edge recesses intersecting the second edges thereof, the edge cutouts or edge recesses defining at least a portion of the coolant outlet plenum.

16. The method of claim 15, wherein providing the manifold structure further comprises providing the manifold structure as an assembled plurality of manifold plates, the manifold plates of the assembled plurality of manifold plates having aligned first edges, the aligned first edges defining the common edge of the manifold structure, and wherein at least some first edges of the aligned first edges each comprise a plurality of thermally conductive fin structures.

17. The method of claim 16, further comprising providing an enclosing structure at least partially surrounding the manifold structure with the plurality of thermally conductive fin structures of the at least some first edges of the manifold plates metallurgically bonded to a base plate of the enclosing structure, the base plate being sized for alignment to an exposed portion of the surface to be cooled when the cooling apparatus is disposed in operational position with the base plate of the enclosing structure coupled via a thermal interface material to the exposed portion of the surface to be cooled.

* * * * *